(12) United States Patent
Chen

(10) Patent No.: US 7,409,752 B2
(45) Date of Patent: Aug. 12, 2008

(54) STRUCTURE OF HOLDING MECHANISM WITH ROTATABLE KNOB FOR RADIATOR

(75) Inventor: Jiun-Tsang Chen, Hsin-Chuang (TW)

(73) Assignee: Asia Vital Components Co., Ltd.

( * ) Notice: Subject to any disclaimer, the term of this patent is extended or adjusted under 35 U.S.C. 154(b) by 84 days.

(21) Appl. No.: 11/485,069

(22) Filed: Jul. 12, 2006

(65) Prior Publication Data

US 2008/0010789 A1 Jan. 17, 2008

(51) Int. Cl.
*A44B 21/00* (2006.01)
*H05K 7/20* (2006.01)

(52) U.S. Cl. .................. 24/459; 174/16.3; 361/704; 257/718; 165/80.3

(58) Field of Classification Search ............. 24/457, 24/459; 165/80.3; 257/718; 361/704; 174/16.3
See application file for complete search history.

(56) References Cited

U.S. PATENT DOCUMENTS

| | | | |
|---|---|---|---|
| 6,731,504 B1 * | 5/2004 | Liu ........................... | 361/704 |
| 7,280,361 B1 * | 10/2007 | Lin ........................... | 361/704 |
| 7,292,442 B2 * | 11/2007 | Yu et al. ..................... | 361/704 |
| 2004/0179340 A1 * | 9/2004 | Lin ........................... | 361/704 |
| 2004/0190262 A1 * | 9/2004 | Lai et al. .................... | 361/704 |
| 2005/0144764 A1 * | 7/2005 | Lin ........................... | 24/459 |

\* cited by examiner

*Primary Examiner*—Robert J. Sandy

(57) ABSTRACT

A structure of a holding mechanism with a rotatable bidirectional knob suitable for securing a radiator is disclosed. The holding mechanism comprises a pressure-bearing unit, a buckling element and an operation assembly. The buckling element and the pressure-bearing unit have a positioning opening respectively. The pressure-bearing unit provides a slot for being penetrated with the buckling element. The operation assembly is pivotally positioned on the buckling element and comprises a bidirectional knob and a protrusion member. The protrusion member presses against the pressure-bearing unit while the bidirectional knob being turned. The buckling element is movably disposed at and of the pressure-bearing unit to effectively secure the radiator in place.

5 Claims, 10 Drawing Sheets

STRUCTURE OF HOLDING MECHANISM WITH ROTATABLE KNOB FOR RADIATOR

FIELD OF INVENTION

The present invention relates to a structure of a holding mechanism, and more particularly, to a holding mechanism comprising a rotatable knob.

BACKGROUND OF INVENTION

Referring to FIGS. 1, 2 and 3, a mechanism for holding a radiator comprises a pressure-bearing unit 11 having a positioning portion (not shown) and an opening 112, and a buckling element 12 having a positioning portion 121 and an axial hole 121a. The axial hole 121a may receive an axle 132 of a handle 13.

To assemble the above components, the buckling element 12 is penetrated through the opening 112 of the pressure-bearing unit 11 to movably connect the buckling element 12 on the buckling element 11, and the axle 132 of the handle 13 engaged into the axial hole 121a of the buckling element 12.

Next, the handle 13 is rotated towards the left until the protrusion 131 of the handle 13 is supported against the pressure-bearing unit 11 and the buckling element 12 is moved upwards, and buckles the positioning portion of the pressure-bearing unit 11 and the positioning opening 121 of the buckling element 12 to the buckling block 141 of the seat 14, as well as support the pressing portion 113 of the pressure-bearing unit 11 against the radiator 15.

However, the handle 13 of the above conventional holding mechanism may be easily damaged due to different operation habit or handling, or even applying excessive force.

Accordingly, in the view of the foregoing, how to resolve the above defect is a very important issue the manufacturers have to face.

SUMMARY OF THE INVENTION

An objective of the present invention is to provide a structure of a holding mechanism, which is capable of reducing the possibility of being damaged due to the wrong operation or usage of excessive force.

Another objective of the present invention is to provide a holding mechanism, in which a bi-directional knob with a protrusion member is capable of rotating clockwise or counterclockwise for the protrusion member pressing against the pressure-bearing unit and the buckling element moving upward to perform the job of securing the radiator effectively.

A further objective of the present invention is to provide a holding mechanism, which is capable of producing a moment of couple while the bidirectional knob being turned for the protrusion member pressing against the pressure-bearing unit easily.

In accordance with the above objectives, a structure of a holding mechanism provided in the present invention comprises a pressure-bearing unit, a buckling element and an operation assembly. The buckling element and the pressure-bearing unit have a positioning opening respectively. The pressure-bearing unit further comprises at least a slot to receive the buckling element. The operation assembly is pivotally positioned on the buckling element and further comprises a bidirectional knob with a protrusion member. The protrusion member presses against the pressure-bearing unit at the time of the bidirectional knob being turned. The buckling element is movably disposed at an end of the pressure-bearing unit to effectively secure the radiator in the chassis while the protrusion member pressing the pressure-bearing unit.

BRIEF DESCRIPTION OF THE DRAWING

For a more complete understanding of the present invention, reference will now be made to the following detailed description of preferred embodiments taken in conjunction with the following accompanying drawings.

DETAIL DESCRIPTION OF THE INVENTION

Figure 1:
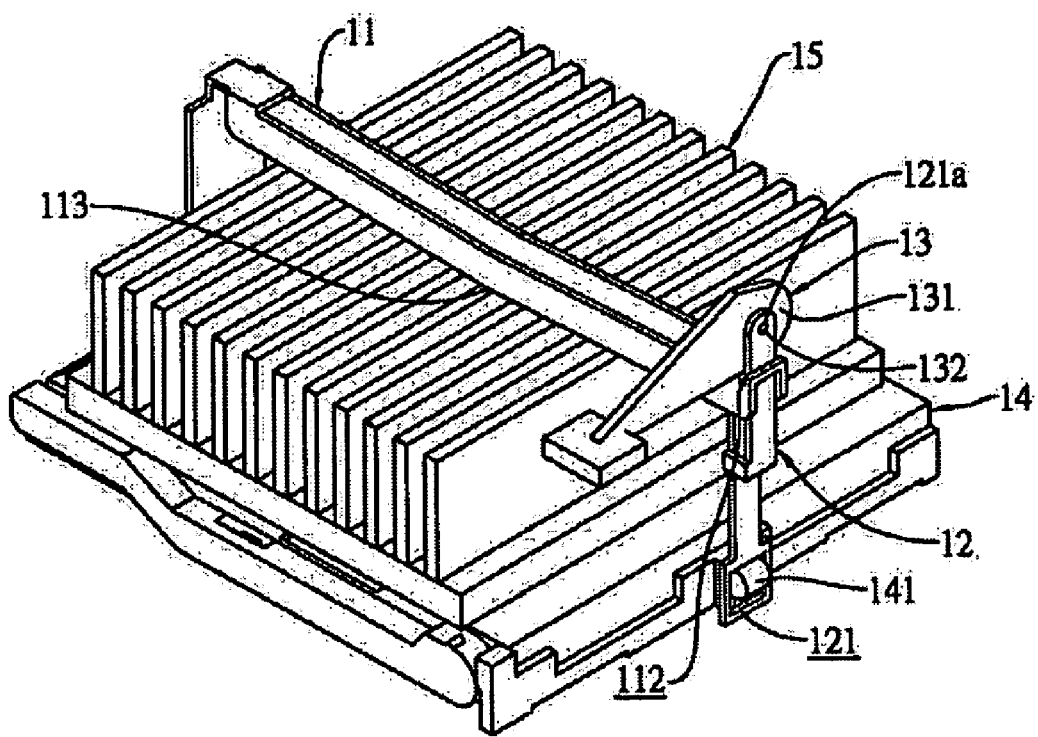
FIG. 1 is a perspective view illustrating the conventional holding mechanism before securing the radiator.
Figure 2:
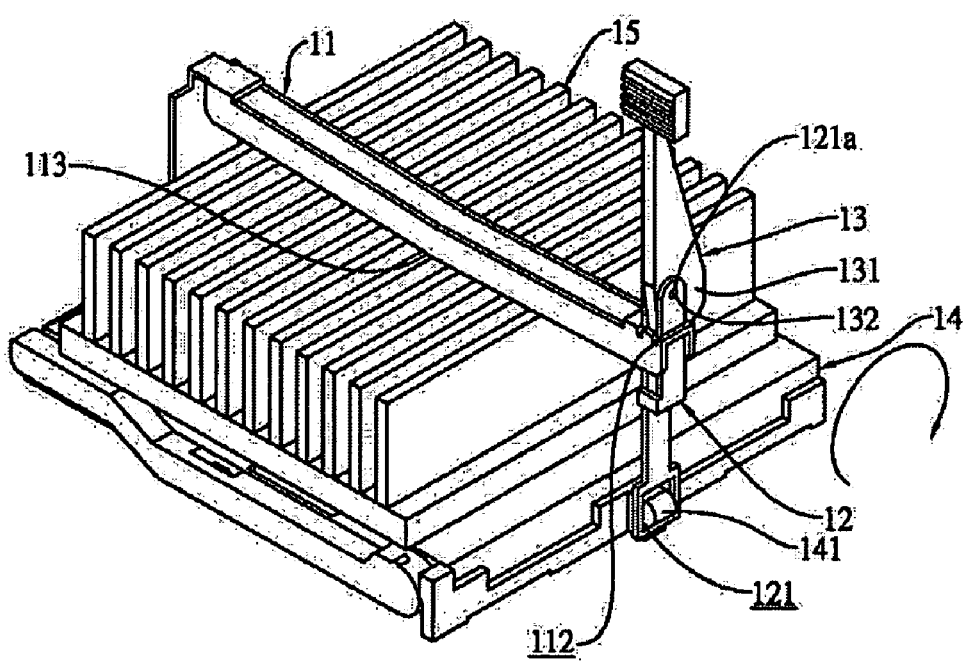
FIG. 2 is a perspective view illustrating the conventional holding mechanism being in the process of securing the radiator.
Figure 3:
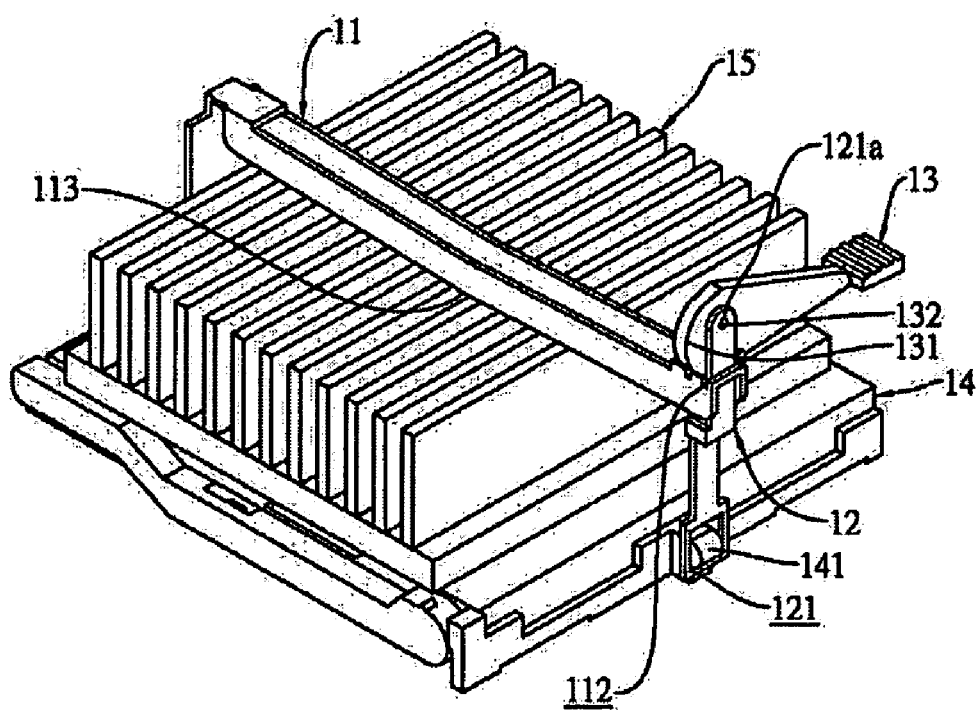
FIG. 3 is a perspective view illustrating the conventional holding mechanism after securing the radiator.
Figure 4:
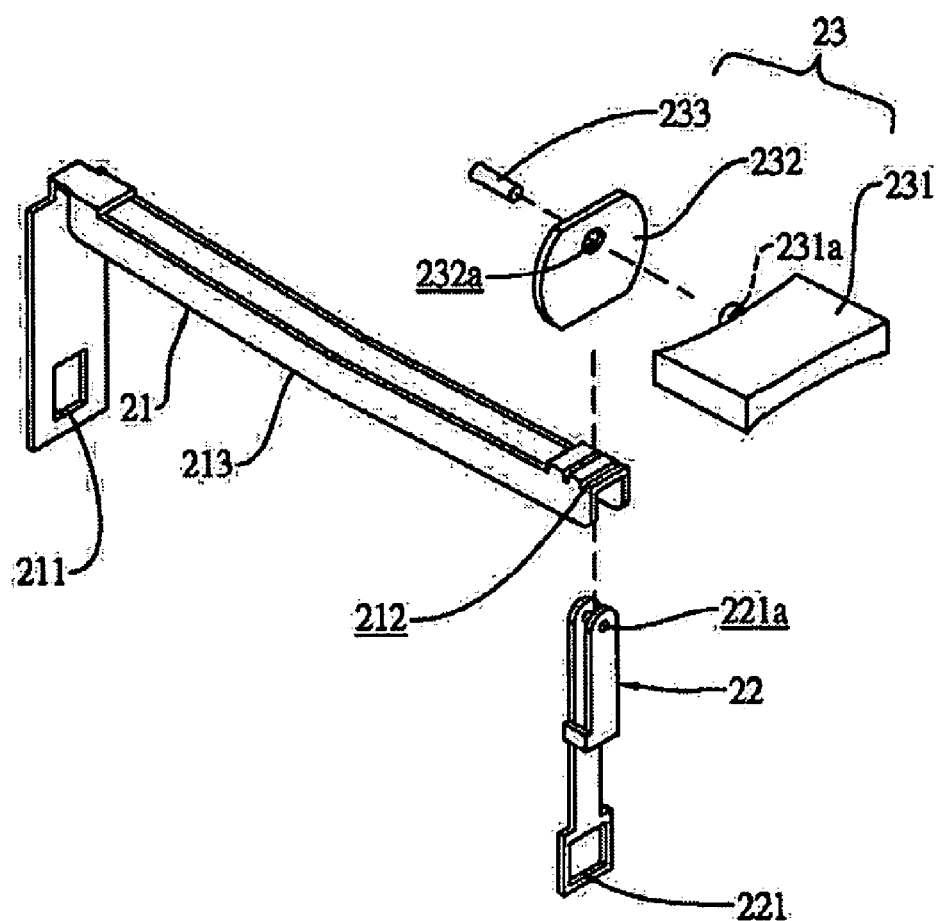
FIG. 4 is a perspective view of a structure of a holding mechanism according to an embodiment of the present invention.

FIG. 4 is a perspective view of a structure of a holding mechanism according to an embodiment of the present invention. Referring to FIG. 4, the holding mechanism comprises a lever shaped pressure-bearing unit 21, a buckling element 22 and an operating assembly 23. The operating assembly 23 further comprises a rectangular bidirectional knob 231, a plate-shaped protrusion member 232 and an axle 233. The buckling element 22 has a positioning opening 221 at the lower end thereof and the pressure-bearing unit 21 has a downward arm at an end thereof. The downward arm has a positioning opening 211 at the lower end thereof corresponding to the positioning opening 221. The pressure-bearing unit 21 further comprises two slots 212 at another end thereof for being passed through with the upper end of the buckling element 22.

Figure 5:
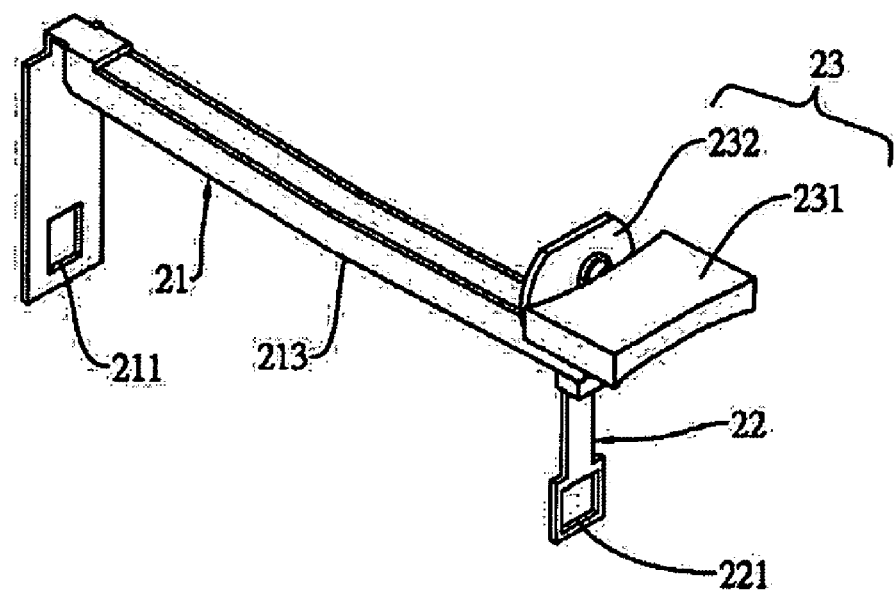
FIG. 5 is a perspective view illustrating the holding mechanism shown in FIG. 4 securing the radiator.

FIG. 5 is a perspective view showing while securing the buckle holding mechanism on the radiator. Hereinafter, the assembly of the holding mechanism is described with reference to FIGS. 4 and 5. The upper end of the buckling element 22 is fork shape with an axle hole 221a to penetrate the slots 212 of the pressure-bearing unit 21 for the axle 233 passing through the axle hole 221a and a through hole 232a, which is provided at the protrusion member 232, and then being fixed to a receiving part 231a of the bidirectional knob 231. In this way, the operating assembly 23 is capable of pivotally engaging with the buckling element 22.

According to the preceding element of the present invention, the operation of the assembly of holding mechanism according to the present invention explained in the following paragraphs.

Figure 6:
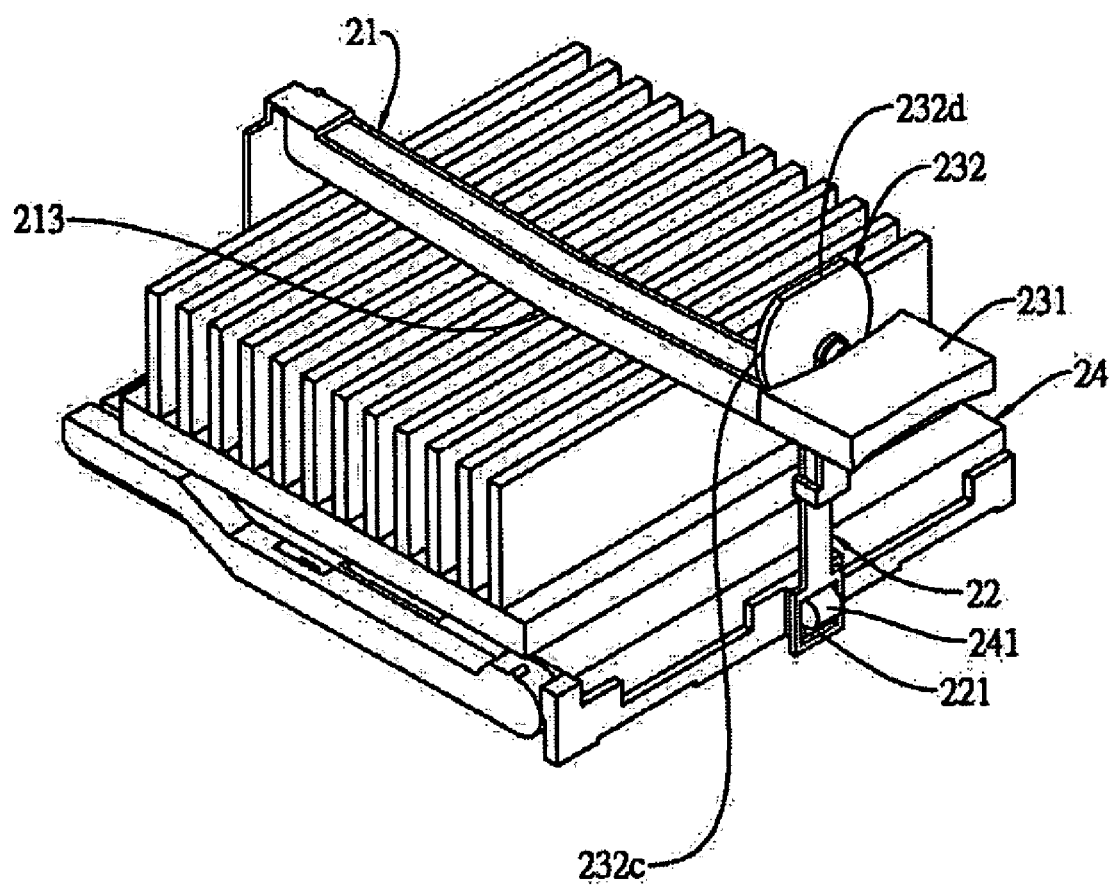
FIG. 6 is a perspective view illustrating the holding mechanism shown in FIG. 4 being in a state of releasing.

First, when the holding mechanism is in a state of releasing, as shown in FIG. 6, the radiator 25 is disposed in the chassis 24 and two buckling blocks 241, which are disposed oppositely at two lateral sides of the chassis 24, extend outward via the positioning openings 211 (not shown) and 221 respectively such that one straight side 232d of the protrusion member 232 faces upwards and the buckling element 22 is located at the lowest position of the stroke thereof.

Figure 7:
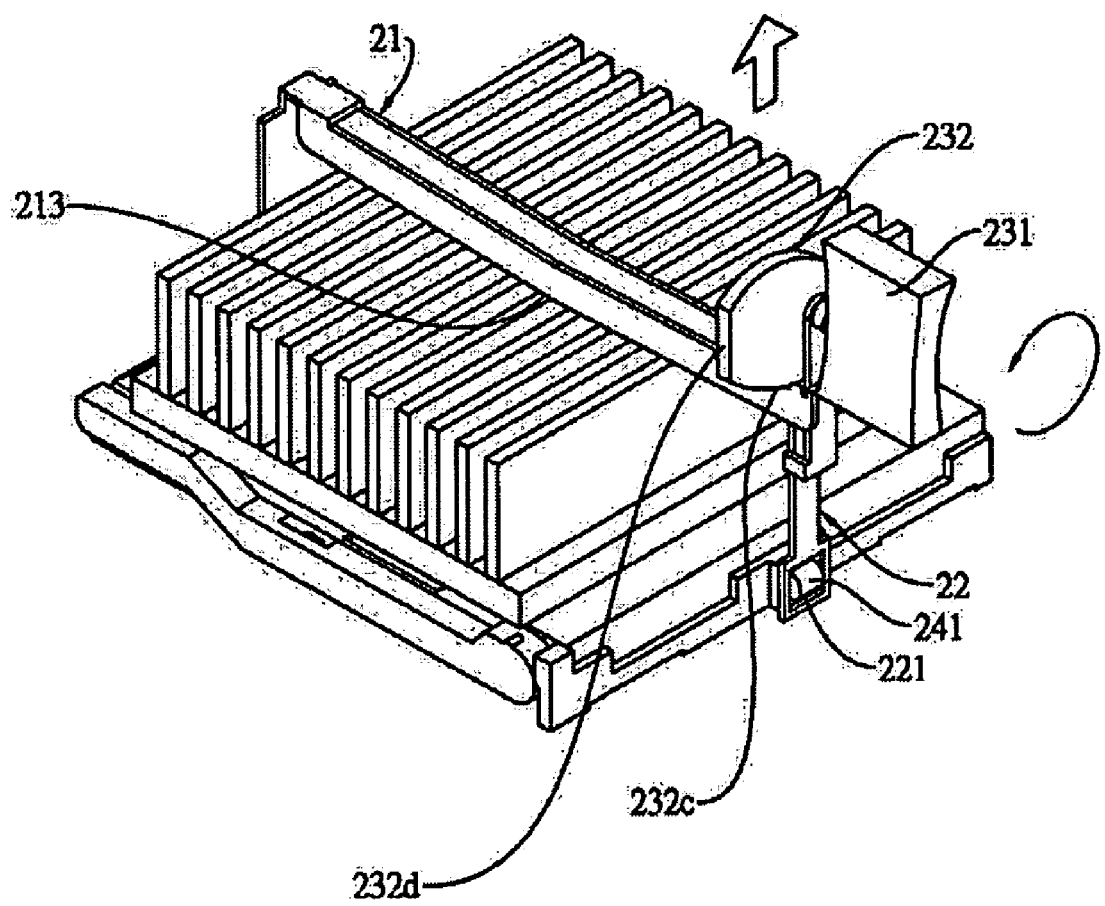
FIG. 7 is a perspective view illustrating the holding mechanism shown in FIG. 4 being in the process of securing the radiator.

Next, when the holding mechanism is in a state of initial clamping, referring to FIG. 7, that is, when the user turns the bidirectional knob 231 counterclockwise, one of two opposite curved sides 232c of the protrusion member 232 presses against the pressure-bearing unit 21 and the buckling element 22 moves upwards such that the straight side 232d of the protrusion member 232 is moved towards the vertical position, and the buckling element 22 moves to the middle position of the stroke thereof.

Figure 8:
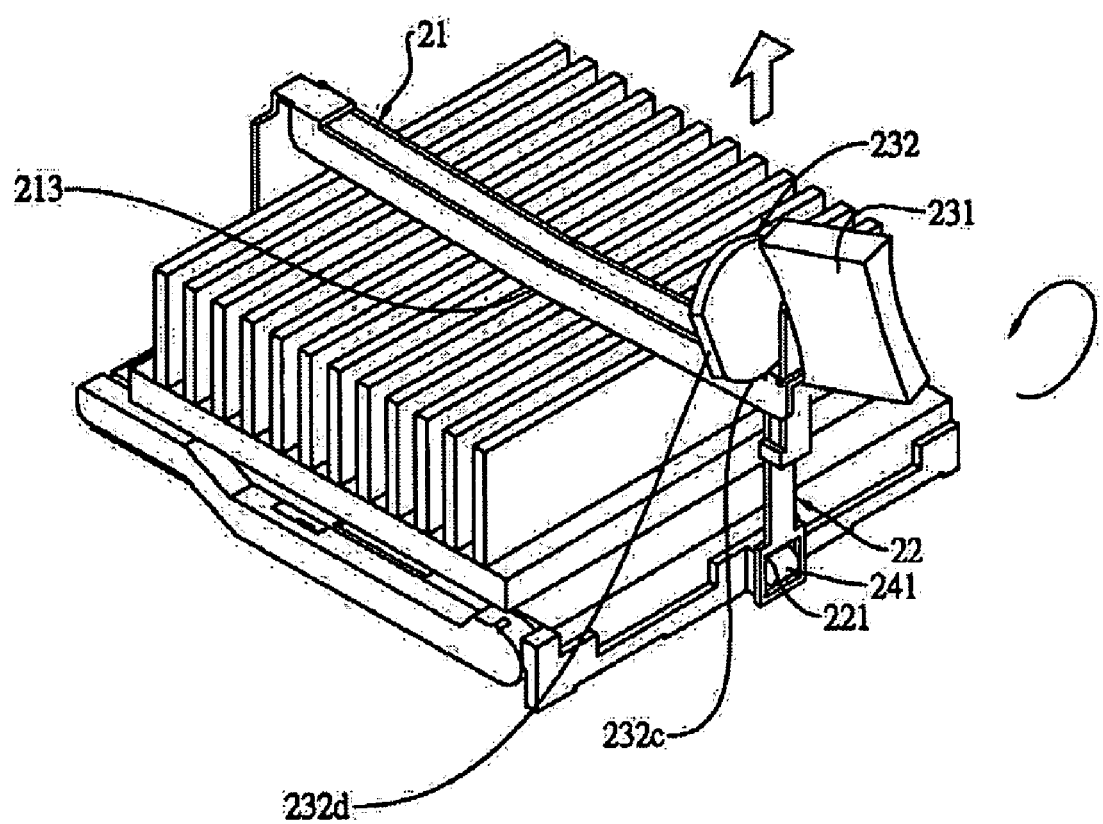
FIG. 8 is a perspective view illustrating the holding mechanism shown in FIG. 4 being in the further process of securing the radiator.

Further, when the holding mechanism is in a state of further clamping as shown in FIG. 8, that is, the bidirectional knob 231 is continuously turned counterclockwise, the curved side 232c, which has pressed the pressure-bearing unit 21, slides on the pressure-bearing unit 21 against the pressure-bearing unit 21 while the protrusion member 232 rotates with the bidirectional knob 231. In this way, the buckling element 22 gradually moves further upwards and the flat side 232d of the protrusion member 232 gradually moves downwards to approach the pressure-bearing unit 21, and the buckling element 22 moves to the upper middle position of the stroke thereof.

Figure 9:
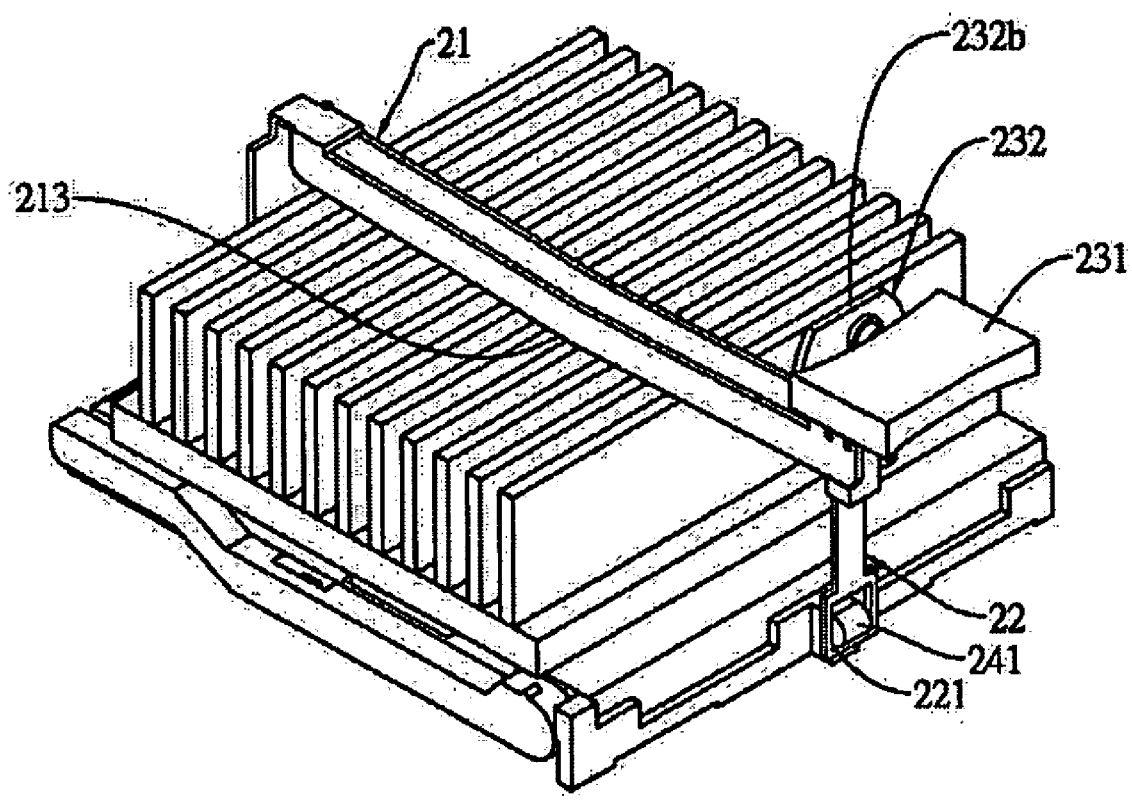
FIG. 9 is a perspective view illustrating the holding mechanism shown in FIG. 4 being in a state of securing the radiator completely.

Finally, when the holding mechanism is in a state of securing the radiator completely, referring to FIG. 9, that is, the other straight side 232b of the protrusion member 232 is disposed horizontally and completely facing upwards, the positioning openings 211 and 221 tightly engage with the buckling blocks 241 of the chassis 24, and the press portion 213 at the middle of the pressure-bearing unit 21 presses down to hold the radiator 25 firmly.

Figure 10:
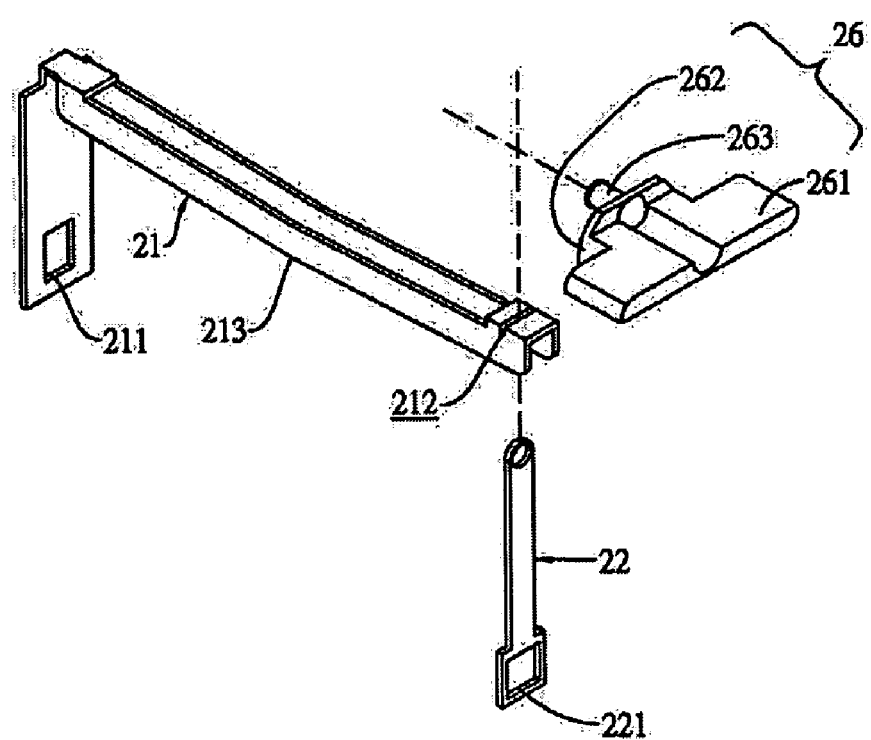
FIG. 10 is an exploded perspective view of a structure of the holding mechanism according to another embodiment of the present invention.

FIG. 10 is an exploded perspective view of a holding mechanism according to another embodiment of the present invention. Referring to FIG. 10, the holding mechanism is similar to the holding mechanism shown in FIG. 4 and has the pressure-bearing unit 21 with the press part 213, the buckling element 22 with the positioning opening 221 and the downward arm with the positioning opening 211. The difference of the instant embodiment is in that the operating assembly 26 is a single piece and comprises an axle 263, a protrusion 262 and a bidirectional knob 261. The bidirectional knob 261 is adopted for the user to hold, and the protrusion 262 is integrally joined to a side of the bidirectional knob 261. Further, the axle 263 extends outward from the protrusion 262. To assemble the operating assembly 26, the upper end of the buckling element penetrates the slot 212 of the pressure-bearing unit 21 and the axle 263 of the operating assembly 26 passes through the axial hole at the upper end of the buckling element 22. Thus, the above simplified structure can be manufactured a lower cost.

Accordingly, the present invention has at least the following advantages.

1. The holding mechanism of the present invention provides the bidirectional knob to support the protrusion member against the pressure-bearing unit so as to move the buckling element on the pressure-bearing unit such that the possibility of the holding mechanism being damaged resulting from different ways or of operations or different work habits done by different personal individuals may be effectively reduced.

2. The bidirectional knob can be rotated either clockwise or counterclockwise without limiting the rotation direction.

3. The moment of couple, which is produced while rotating the bidirectional knob, allows the user to operate the bi-directional knob with less effort.

While the invention has been described in conjunction with a specific best mode, it is to be understood that many alternatives, modifications, and variations will be apparent to those skilled in the art in light of the foregoing description. Accordingly, it is intended to embrace all such alternatives, modifications, and variations in which fall within the spirit and scope of the included claims. All matters set forth herein or shown in the accompanying drawings are to be interpreted in an illustrative and non-limiting sense.

What is claimed is:

1. A holding mechanism for securing a radiator comprising:
   a pressure-bearing unit with a first end and a second end;
   a buckling element with an upper end and a lower end having an axle hole at said upper end, and penetrating said first end with said upper end; and
   an operating assembly being disposed on top of said pressure-bearing unit and pivotally engaged to said upper end;
   wherein said operating assembly comprises a bidirectional knob, which has a receiving part at a lateral side thereof, a plate-shaped protrusion member, which provides an eccentric through hole corresponding to said axle hole, and an axle, which is fixed to said receiving part after piercing said through hole and said axle hole, such that when said bidirectional knob is turned manually, said protrusion member is capable of pressing against said pressure-bearing unit, and said buckling element is capable of moving a stroke to secure the radiator in place.

2. The holding mechanism according to claim 1, wherein said protrusion member has a first straight side and a second straight side, which are opposite to each other, and said eccentric through hole is disposed near said first straight side.

3. The holding mechanism according to claim 1, wherein when said protrusion member is rotated to a position with said first straight side being disposed upward, said second straight side presses against said pressure-bearing unit firmly and the radiator is secured completely.

4. The holding mechanism according to claim 1, wherein when said protrusion member is rotated to a position with said second straight side being disposed upward, said the radiator is released completely.

5. The holding mechanism according to claim 1, wherein said protrusion member has two opposite curved sides and when said protrusion rotates to a position with one of said curved sides being disposed upward, the radiator is in a process of being secured.

* * * * *